INVENTOR.
JOHN P. O'BRIEN

BY
Ostrolenk & Faber
ATTORNEYS

Oct. 29, 1957 J. P. O'BRIEN 2,811,637

ULTRA HIGH FREQUENCY TURRET TUNER WITH UNIFORM BAND SPREAD ON ALL BANDS

Filed May 26, 1953 5 Sheets-Sheet 2

INVENTOR.
JOHN P. O'BRIEN

BY Ostrolenk & Faber
ATTORNEYS

INVENTOR.
JOHN P. O'BRIEN
BY
Ostrolenk & Faber
ATTORNEYS

INVENTOR.
JOHN P. O'BRIEN
BY
Ostrolenk & Faber
ATTORNEYS

INVENTOR.
JOHN P. O'BRIEN
BY
Ostrolenk & Faber
ATTORNEYS 2,811,637
Patented Oct. 29, 1957

1

2,811,637

ULTRA HIGH FREQUENCY TURRET TUNER WITH UNIFORM BAND SPREAD ON ALL BANDS

John P. O'Brien, Huntington, N. Y., assignor to Standard Coil Products Co., Inc., Los Angeles, Calif., a corporation of Illinois Application May 26, 1953, Serial No. 357,495
7 Claims. (Cl. 250—20)

The present invention relates to television tuners and more specifically it relates to television tuners operable at ultra-high frequencies.

It is well known in the art that essentially two methods of tuning have evolved during the development of U. H. F. television tuners; namely, continuous tuning and discrete channel step tuning.

Of the two methods, the second has considerable advantages due to the ease with which channel selection can be made since, by discrete tuning, one can select a channel without having to accurately align the tuner to the correct channel frequency.

One of the most important problems encountered in the development of such discrete television tuners is that of accurately tuning at all ultra-high frequencies where, as is well known, the use of lumped constants becomes problematic. It was found, in fact, that at the highest ultra-high frequencies, around 1,000 megacycles, the tuning inductance for an oscillator may consist solely of a short circuit.

Another problem was that of obtaining equal band spread for the U. H. F. oscillator regardless of the frequency at which the oscillator operates. This problem arises from the fact that each television channel is given a band of six megacycles whether at V. H. F. or the highest U. H. F. On the other hand, it is known that if a single variable tuning element is used for operation at low frequencies and at high frequencies, while the mechanical movement of such a tuning element by a certain angle may encompass a relatively small number of channels when operating at high frequencies rotation through the same angle would encompass a much larger number of channels.

In a discrete tuner it is necessary to have such a constant band spread so that at each position of the tuner only the desired six megacycles corresponding to the channel selected are passed to the utilization circuits of the television set. To increase the ease of selecting television channels, a so-called decimal type of discrete tuning can be used. In such a system, the whole television range is divided into a number of bands, each of these bands comprising ten channels. The operation of such a decimal type discrete tuner may then consist of two steps; the selection of the band and the selection of a channel within that band.

Since in the decimal system each band consists of ten channels, each band will encompass sixty megacycles. In addition, in order to select with ease an individual channel among those in a certain band, it is necessary to provide a tuning element so that the rate of change of the frequency with respect to the angular rotation of the element will be always equal to a constant. This means that equal angular rotation of the tuning element should give equal changes of frequency.

The problem encountered with the tuning of the oscillator at the highest U. H. F. frequencies appears also in the preselector, which is the stage immediately following the antenna connections. The preselector too must be capable of operation up to approximately nine hundred megacycles and at the highest frequencies the electrical elements determining the tuned frequency must have finite magnitudes and not be short circuits so that a definite control of the frequency of operation of the preselector may be obtained.

These problems are overcome by the present tuner which consists essentially of a preselector, mixer and oscillator, all tunable through discrete steps. The tuning elements for both the oscillator and the preselector are lumped inductances from the lowest to the highest frequencies of operation. These tuning elements serve to switch in the desired bands in the U. H. F. range.

In addition, a channel selecting element, in this embodiment a variable capacitor, is designed to have a straight line frequency response and serves to select an individual channel among the channels of each band. A single capacitor is used for channel selection in all the U. H. F. bands. More specifically, each of the previously mentioned inductances switches in bands of sixty megacycles while the variable capacitor that accomplishes the tuning within each sixty megacycles band is the same capacitor regardless of the band and varies the frequency linearly over each range and has a spread of exactly sixty megacycles between minimum and maximum rotation of each band.

Accordingly, one of the objects of the present invention is a television tuner in which the oscillator has equal band spread.

Another object of the present invention is a variable capacitor capable of varying the frequency of the oscillator linearly and having a constant spread between minimum and maximum rotation at any television band.

A further object of the present invention is a decimal type discrete tuner using lumped elements for tuning in the U. H. F. region.

Still another object of the present invention is the provision of controlled tuning elements at the highest U. H. F. frequencies.

The oscillator of the present tuner consists of a high frequency triode with tuning elements switched in between its plate and its grid. The tuning elements are inductances in series with the plate and the grid and connected to each other through a fixed and a variable band spread capacitance in parallel. The variable capacitance permits accurate trimming of the oscillator.

Stationarily connected to the oscillator tube terminals is a set of male contacts of a wafer switch, in this embodiment, circularly shaped. The female elements of the wafer switch are mounted on the circumference of circular dielectric plates. The male contacts are mounted as close as possible to the pins of the oscillator tube and since the tuning elements, in this case inductances, are connected across each pair of female contacts a very short electrical path exists between the tube pins and the tuning elements. By this means, even at the highest frequencies it is possible to use easily controllable lumped inductances.

Also mounted very close to the base of the oscillator tube is a channel selecting capacitor consisting of conductive plates having at their ends another set of male contacts for the previously mentioned wafer switch. A dielectric or conductive plate whose construction will be described hereinafter is movable between the plates to vary the capacitance at such a rate that equal angular rotation corresponds to equal frequency changes regardless of the position of the tuner in the frequency range. This plate is completely insulated from the chassis by the provision of an insulating shaft so that, electrically, it will be floating.

The two dielectric discs are mounted on a common shaft provided with positioning means corresponding to the accurate contact making position between the previously mentioned dielectric plate mounted female contacts and stationarily mounted male contacts.

Means are also provided for varying slightly the inductance of the tuning elements and the capacitance of the band spread capacitors. In the case of inductances, a non-conducting coil form may be introduced in the coil and a screw inserted therein so that the position of the screw will determine the inductance of the coil. Similarly, a screw within a dielectric cylinder may be positioned between two plates of any form such that variation of the position of the screw will determine the capacitance between the plates.

It is necessary to point out that these trimming elements are mounted on the dielectric plates and are easily accessible from the outside.

Accordingly, another object of the present invention is the provision of very short paths between the pins of the oscillator tube and the tuning elements to reduce the stray inductances.

The preselector of the tuner of the present invention can be constructed in a similar way to reduce lead or contact inductances.

Still another object of the present invention is the provision of very short paths between the tuning elements and ground of the preselector to reduce stray inductances.

Another object of the present invention is the provision of means for varying the inductance of the tuning elements and the capacitance of the band spread control capacitors.

In addition, it was found that in order to have more control over inductance at the high frequencies series capacitors may be connected to the tuning inductances. The addition of these series capacitances results not only in more controlled inductance but also in less shunting capacitance necessary to produce the desired sixty megacycle band spreads at the high bands.

Another object of the present invention is, therefore, the provision of means for producing constant band spreads at the high end of the ultra-high frequency range and for making possible the use of larger controllable inductances.

Similar series capacitors are also connected to the tuning inductances of the preselector at the highest frequency bands and they provide also a means for controlling the band spread.

A further object of the present invention is, therefore, the provision of means for controlling the band spread and for making possible the use of physically large controllable inductances.

The problems encountered in the preselector and overcome by the present invention are essentially as pointed out above, those described in connection with the oscillator, but in the mixer section if a low capacity link is used as the injecting device for injecting the oscillator signals into the mixer, as the oscillator frequency is varied over any given pass band the injection current through the mixer varies, thereby changing the pass band response between different oscillator settings on the same band. The reason for this phenomenon is that for a fixed pass band preselector with the oscillator operating at approximately forty megacycles higher than the incoming signals the oscillator frequency moves from a point on the pass band to the skirt outside the pass band as the oscillator is tuned from minimum to maximum frequency over a given band. Hence, the impedance given to the oscillator injection varies over the band; the mixer current varies, and the impedance presented by the mixer changes causing a variation in the pass band.

To overcome this difficulty a compensating device is used in the present invention. This compensating device consists essentially of a conductive strip provided at one end with a spring section actuated by the shaft of the variable capacitor. The spring strap serves as a coupling means to the output of the oscillator and if the end of the variable capacitor shaft is properly shaped, rotation of this shaft will cause movement of the strap with respect to the oscillator terminal, thus providing a compensation for the effects described above through equal and opposite impedance changes.

By the use of such a method of injection, the injection current was found to vary by a very small ratio with consequent good band pass stability with respect to changes in oscillator frequency over any given band. It was also found that the ratio of maximum injection current on any one band to minimum current on any other band was within acceptable values.

Another object of the present invention is, therefore, a device for compensating for changes in impedance presented by the mixer which might cause variations in the pass band.

Actually the injection method described above provides variable coupling only at the oscillator end and not at the mixer end, which is quite satisfactory in the case of a preselector capable of selecting sixty megacycle bands in the U. H. F. region but not individual channels in the sixty megacycle bands.

When the preselector is provided with a straight line frequency variable capacitor to permit selection of individual channels in each band, as in another embodiment of the present invention, the injection system consists of two conductive plates secured to or an integral part of the oscillator variable capacitor and the preselector variable capacitor to which the plate of the oscillator tube and the mixer crystal are, respectively, connected. In addition to these conductive plates, the common shaft carrying the movable plates of the two capacitors is provided with a silver or other conductive plating tapered at the two ends, where capacitive action exists between the silver plating on the shaft and the two stationary conductive plates. The tapering is arranged so that since the shaft rotates only through a predetermined number of degrees less than 360°, capacitive coupling between the stationary plates and the silver plating decreases as the capacitance of the capacitor decreases or as the corresponding frequency increases.

By such an injection method it is possible to obtain optimum mixing at all frequencies of the desired frequency region.

Accordingly, a further object of the present invention is the provision of means for varying the injection from oscillator to mixer at both ends, namely at the output of the oscillator and at the input of the mixer.

To an input of the television tuner is connected a novel broad band U. H. F. impedance transformer which, in this particular embodiment, serves to transform the 300 ohm impedance presented by the twin lead transmission line from the antenna to the 50 ohm input impedance of the tuner. This novel transformer consists of a short section of twin leads from the 300 ohm transmission line connected to two more sections in parallel of the same twin lead type. These two sections are followed by three more sections of the same type also in parallel.

Such an input transformer has an average standing wave ratio which is close to one from 400 megacycles to 900 megacycles, that is, throughout the U. H. F. range.

Another object of the present invention is, therefore, an impedance transformer having a small and constant standing wave ratio throughout the U. H. F. range.

These and other objects of the present invention will become apparent from the description taken in connection with the drawings, in which.

Figures 1, 1A:
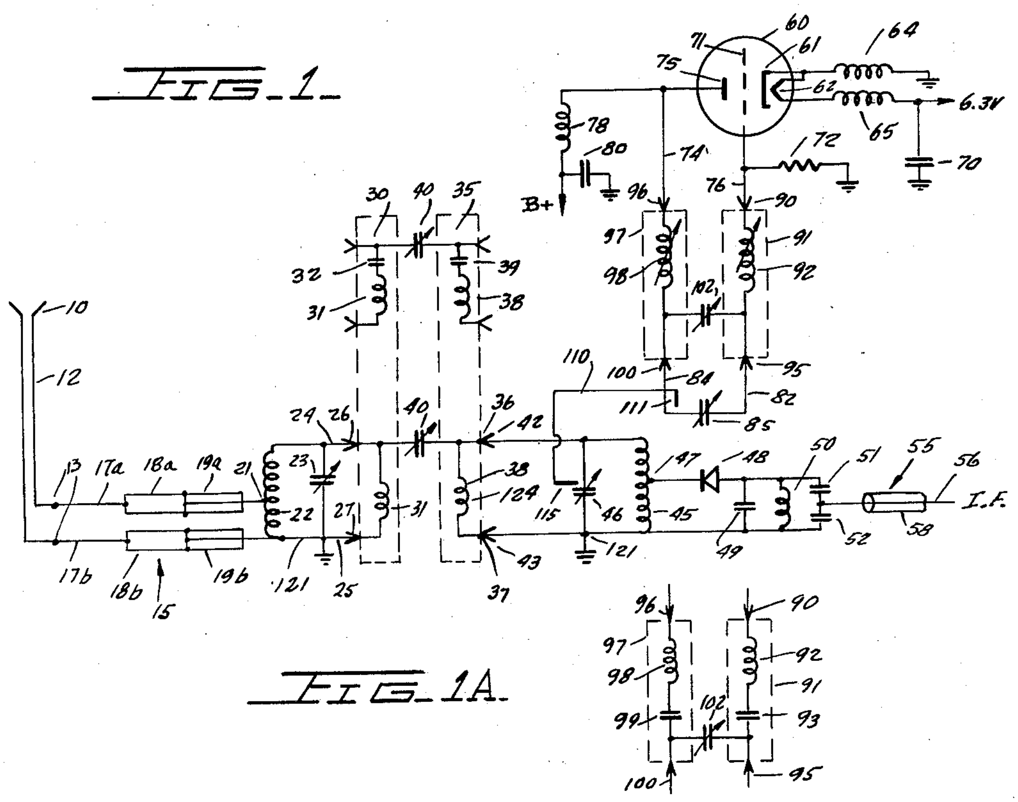
Figure 1 is the circuit diagram of one embodiment of the present invention.
Figure 1A is a detail drawing of the tuner of the present invention showing its high frequency tuning elements.

Referring first to Figure 1, showing the electrical circuit diagram of this novel U. H. F. tuner, the U. H. F. antenna 10 is connected by means of a transmission line 12, for example, of the twin lead type to the input terminals 13 of the input transformer 15. Input transformer 15 serves to change the impedance from the 300 ohm level at the input side to 50 ohms at the output side in the present embodiment.

Input transformer 15 consists of three sections. The first section 17 is formed by one 2½ inch section of 150 ohm twin lead line. Each of the twin leads **17*a* and 17*b* is in its turn connected to a section 18 of 150 ohm twin lead line. These sections 18 are 1⅛ inch long and are each connected at their other end to three one inch sections 19** of the same type lead.

The leads forming each set 19 are connected together at the input and output, and while set **19*a* is connected to ground set 19*b* is connected to a tap on the inductive coil 22**.

In the embodiment shown in Figure 1, coil 22 is shunted by a variable capacitance 23 of approximately .5 to 3.0 micromicrofarads which serves to give an equal band spread of approximately 60 megacycles at any U. H. F. range from approximately 400 megacycles to approximately 900 megacycles.

To this parallel combination are connected male contacts 24 and 25 which, as described hereinafter, are stationary and are engaged by the female contacts 26 and 27 mounted on an insulating disc 30. As will be later described, disc 30 is rotatable and during its rotation will connect across contacts 24 and 25 coils of different inductances or series L–C circuits to permit the selection of any desired 60 megacycle band in the U. H. F. region.

For example, at the lower ultra-high frequencies, mounted on disc 30 and connected across female contacts 26 and 27 is the tuning inductance 31.

In alignment with and rotatable with disc 30 is a second insulating disc 35. Disc 35 similarly carries a plurality of female contacts such as 36 and 37 across which is connected for the lower ultra-high frequencies a tuning inductance 38.

A small variable capacitance 40 connects coil 31 to coil 38. To tune the higher ultra-high frequencies, a circuit consisting of a capacitor 32 in series with an inductance 31 on disc 30 and a capacitor 39 in series with an inductance 38 on disc 35 is connected over contacts 24—28 and 42—43 with capacitor 40 coupling circuit 31—32 with circuit 38—39.

Function of capacitors 32 and 39 is to permit the use of physically larger inductances 31 and 38 for tuning of the higher ultra-high frequencies, for otherwise at these high frequencies coil 31 and 38 would have to be practically short circuits.

In addition, capacitors 32 and 39 serve to control the band spread at different frequencies, so as to obtain always a band spread of, for example, 60 megacycles. The magnitude of these capacitors is about five or six micromicrofarads.

Female contacts 36 and 37 are shown in Figure 1 in engagement with male contacts 42 and 43 respectively, to which a parallel circuit consisting of inductance 45 and capacitance 46 is connected.

Capacitance 46 is a variable capacitance of the same order of magnitude as capacitance 23; that is, from .5 to 3.0 micromicrofarads.

Connected between ground and a few turns of coil 45 is a circuit consisting of a crystal mixer 48 in series with capacitance 49. Across capacitance 49 is connected a coil 50 which, with capacitance 49, is tuned to the intermediate frequency of the television receiver, at the present time, approximately forty megacycles.

Also connected across coil 50 is a voltage divider consisting of two capacitors 51 and 52, each of 10 micromicrofarads. The I. F. output is obtained by means of a coaxial cable 55 by connecting the inner conductor 56 of coaxial cable 55 between the two capacitors 51 and 52 while the outer conductor 58 of cable 55 is connected to ground. Between conductors 56 and 58 will then appear the desired signals at the correct intermediate frequency.

As previously mentioned, except for the electrical components mounted on discs 30 and 35 all the other components are stationary and mounted directly on the chassis of the television tuner. Also mounted on the television tuner is the U. H. F. oscillator consisting of a high frequency triode such as the 6AF4, here denoted by numeral 60, having its cathode 61 tied to one side of filament 62 and connected to ground through a radio frequency choke 64. The other side of filament 62 is connected through a second radio frequency choke 65 to the 6.3 volt filament supply.

In addition, the radio frequency choke 65 is connected to ground through a 1,000 micromicrofarad capacitor 70. The grid 71 of tube 60 is connected to a grid leak resistor 72 having its other side connected to ground and to a stationary male contact 76. Plate 75 of tube 60 is also directly connected to a male contact 74 in alignment with contact 76.

In addition, plate 75 is connected to the B+ supply through a radio frequency choke 78 by-passed to ground by capacitor 80. Capacitor 80, in the present example, has a magnitude of 1,000 micromicrofarads.

Also mounted stationarily is another pair of male contacts 82 and 84 across which is connected a variable capacitor 85, which as described hereinafter serves for selecting a desired channel within any U. H. F. band.

During operation of the tuner, across male contacts 76 and 82, and 74 and 84, respectively, is connected a circuit consisting of the tuning inductances and capacitances. More specifically, male contact 76 connected to grid 71 of tube 60 is in engagement with the female contact 90 mounted on an insulating disc 91 and connected to a tuning coil 92 also mounted on insulating disc 91. The other end of coil 92 is connected to another female contact 95 also on insulating plate 91 which engages male contact 82 of variable capacitance 85.

Similarly, male contact 74, which is connected to the plate 75 of U. H. F. triode 60, is connected to the female contact 96 on insulating disc 97 in alignment and rotatable with insulating disc 91. Female contact 96 is connected to a tuning inductance 98 of the same magnitude as inductance 92. The other end of inductive coil 98 is connected to another female contact 100 which is shown in Figure 1 in engagement with stationary male contact 84 of variable capacitor 85.

A variable padding capacitance 102 is connected between inductance 92 and inductance 98 from one insulating disc 91 to the other insulating disc 92 to provide the necessary equal band spread of sixty megacycles for operation at the desired U. H. F. frequencies.

Capacitor 85, on the other hand, serves through its variation to obtain selection of a channel in the U. H. F. band tuned in by means of inductances 92 and 98.

At the highest U. H. F. bands, it is found that the magnitudes of inductances 92 and 98 must be very small, thus making frequency control by means of inductances 92 and 98 difficult at those frequencies. To improve control over frequency at the highest U. H. F. bands, capacitors 93 and 99 (see Figure 1*a*) are connected in series to inductances 92 and 98, respectively, where inductances 92 and 98 are the ones to be connected to plate 75 and grid 71 of tube 60 to cause tube 60 to oscillate at these highest U. H. F. bands. By the addition of capacitors 93 and 99, the number of turns of coils 92 and 98 can be increased considerably, thus providing the necessary amount of control over the frequency of oscillation of tube 60.

Injection device 110 consists in one example of a conductive strip having at one end a conductive section 111 which capacitively couples the output from oscillator 60 obtained from one plate of variable capacitance 85 to the conductive strap 110. The conductive strap 110 serves to conduct the oscillator signals to mixer 48 to which it is also capacitively coupled at 115.

It is important to point out that the novel oscillator will switch in sixty megacycles bands in large steps when the correct inductances 92 and 98 are connected between the grid 71 and the plate 75 of tube 60. In addition, through operation of capacitance 85 the oscillator 60 will tune in six megacycle bands corresponding to individual channels. Each set of circuits 92—93—102 (Figure 1) or 92—93—98—99—102 (Figure 1*a*), therefore, tunes in sixty megacycles at different frequencies from approximately 400 to approximately 900 megacycles while the single capacitor 85 is capable of selecting any channel within each band by continuous rotation of the same.

In other words, capacitor 85 varies the frequency linearly through sixty megacycles over each range; or, to be more precise, capacitor 85 varies the frequency linearly over each range and has a spread of exactly sixty megacycles.

It is also necessary to point out that male contacts 74 and 76 are connected as close as possible to the pins of tube 6AF4 so that the smallest amount of stray inductance is introduced in the circuit by the connections. This and the addition of series capacitances 93 and 99 makes the magnitude of inductances 92 and 98 at the highest U. H. F. bands such that they may be easily controlled.

Inductances 92 and 98 are actually variable to permit the tuning operation during assembly or installation of the television set.

Similarly, in order to adjust the band spread, capacitors 102 are also made adjustable.

As for the band preselector which uses tuning elements 31 and 38, inductances 22 and 45 represent the basic input and output inductances with taps 21 and 47, respectively, for input and output connections at proper impedance levels. Capacitances 23 and 46, as previously mentioned, are variable and are adjusted to resonate with inductances 22 and 45, respectively, at a basic frequency lower than the lowest frequency in the U. H. F. television band.

The switched-in inductances 31 and 38 serve to increase the resonant frequency in sixty megacycle steps when connected in parallel with inductances 22 and 45 respectively.

Capacitor 40, which is adjustable, is different for every sixty megacycle band, each capacitor 40 being adjusted for proper coupling on each band.

Figure 3:
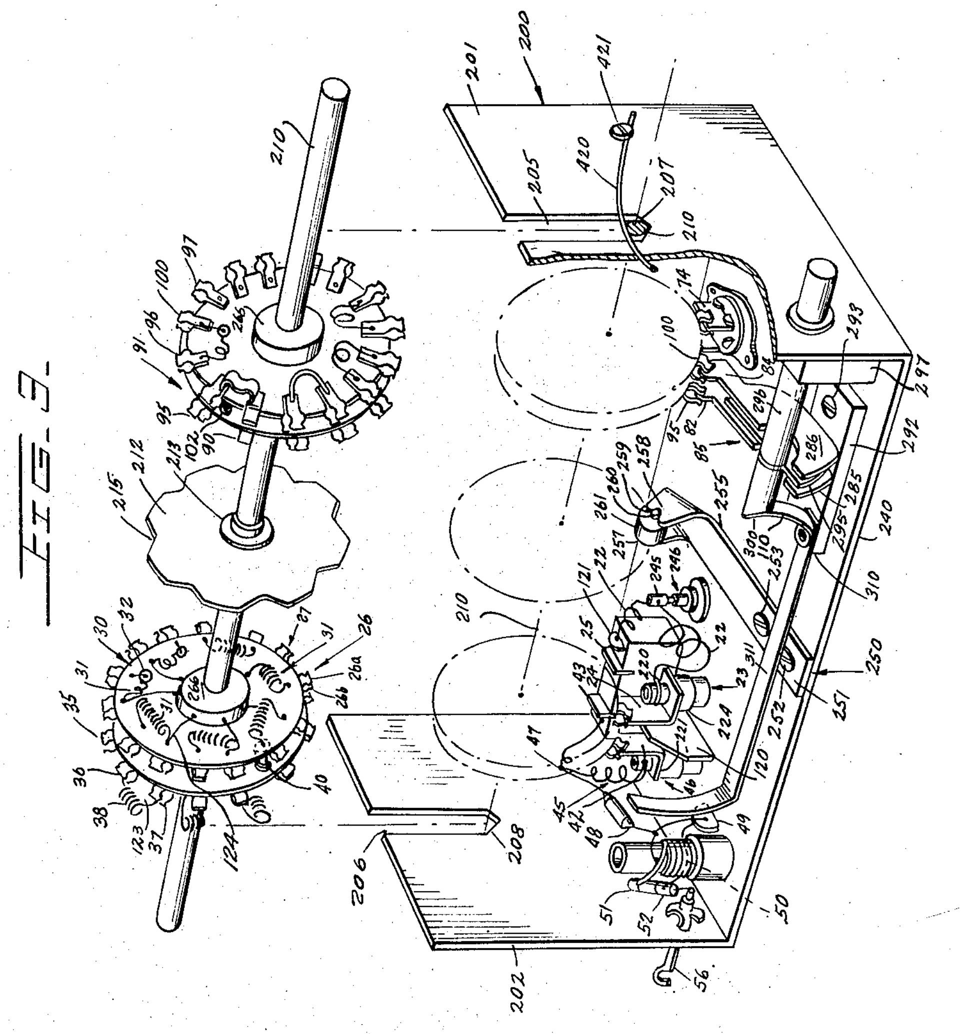
Figure 3 is an exploded view of the tuner of Figure 1.

In the embodiment shown in Figures 1 and 3, a ground plane 120 is extended from the grounding block 121 to which male contacts 25 and 43 are fixedly connected. The detector 48, in this case a 1N82 crystal, is tapped to the output coil 45 at its appropriate point 47. It will be noted that inductances 22 and 45 are connected to capacitance 23 and 46, respectively, and all grounded on the grounding block 121.

As will be described in more detail hereinafter, coils 31 and 38 mounted on insulating discs 30 and 35 have their grounding ends 123 and 124, respectively, connected by means of short lengths of wire to a grounding block mounted on the conducting shaft. As described later, these wires form a spider and serve to make it impossible for suck-outs to be produced by coils other than the ones switched in on any band. These suck-outs create otherwise spurious responses in the desired pass band. By means of this grounding spider such suck-outs are eliminated.

Figure 2:
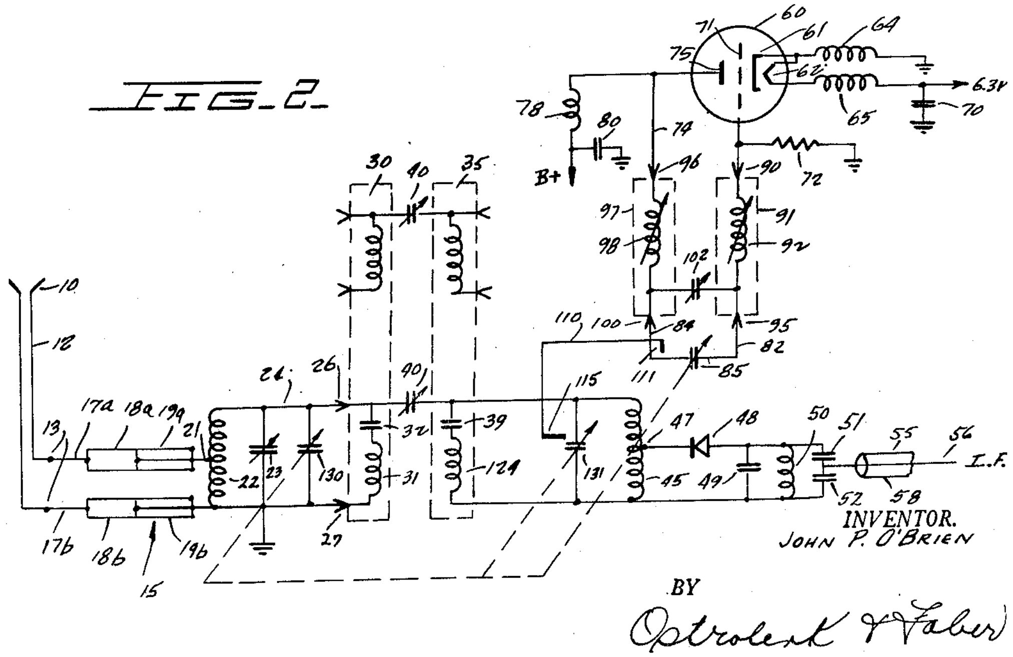
Figure 2 is the circuit diagram of another embodiment of the present invention.

In another embodiment of the present invention shown in Figure 2, the band preselector is provided with tuning capacitors 130 and 131 on the input and output side, respectively, of the preselector. Correspondingly, variable capacitance 46 is eliminated.

It will be noted that all of the elements that were described in Figure 1 have been given the same numerals in Figure 2.

Capacitances 130 and 131 connected across inductances 22 and 45 respectively track with capacitance 85 of oscillator tube 60 over each sixty megacycle band with a band width of about twenty to thirty megacycles. By means of capacitances 130 and 131, it is thus possible to decrease the pass band from sixty megacycles to 20–30 megacycles within which the desired television channel is located.

In the embodiment shown in Figure 2, variable capacitor 23 which was previously mentioned varies from .5 to 3.0 micromicrofarads and serves to balance, on the input side, the capacity of crystal 48 on the output side so that equal band spreads are achieved in both input and output of this preselector.

Referring now to Figure 3 which is the physical embodiment of the circuit diagram shown in Figure 1, the novel television tuner consists of a chassis, usually metallic, here denoted by numeral 200.

Chassis 200 is rectangularly shaped and is provided with end plates 201 and 202. Each plate 201 and 202 has a centrally located slot 205 and 206, respectively, ending with an approximately V-shaped portion 207 and 208. The V-shaped portions 207 and 208 serve as stationary bearings for shaft 210 which carries the tuning elements of the novel tuner.

More specifically, mounted on shaft 210 are sets of dielectric plates 30 and 35 for the preselector and 91 and 97 the oscillator. In addition, a metallic disc 212 is firmly secured to shaft 210 in any suitable way, for example, by means of a sleeve 213 fixedly secured to shaft 210 by means of, for example, a screw (not shown).

Disc 212 which is provided with peripheral notches 215 corresponding in number to the number of U. H. F. bands in which the U. H. F. range has been divided serves as described more in detail hereinafter to positively position the tuning elements mounted on the dielectric discs 30, 35, 91 and 97 with respect to the stationary parts of the preselector and oscillator circuits, respectively.

For purposes of brevity, only one of the two dielectric plates 30 and 35 will be here described in detail with the understanding that the other plate, for example 35, may be physically different since it is the physical embodiment of another portion of the electrical circuit shown in Figure 1.

In most cases, however, in order to provide for example good balance between the two sides of the preselector, the circuit elements mounted on dielectric plate 30 will be the exact duplicate of those mounted on dielectric plate 35.

Plate 30 is circularly shaped and carries at its outer circumference a plurality of female contacts 26 and 27. Female contacts 26 and 27 consist of two members such as 26a and 26b between which will be positioned the male contact during operation of the turner. Connected between each side of female contacts 26 and 27 is a circuit consisting of either a coil 31 or of a coil 31 and a series capacitor 32. Inductor 31 and capacitor 32, or just inductor 31 are electrically connected to female contacts 26 and 27 by any appropriate means, for example, solder.

It will be noted that all these electrical elements 31 and 32 are mounted on the outer side of the drum formed by discs 30 and 35. In addition, connecting the tuning elements on disc 35 and the corresponding tuning elements on disc 30 are a plurality of coupling capacitors 40 of which only one is shown in Figure 3. Such capacitors must be variable and may be of the type shown in Figures 9 and 10 described in connection with the oscillator section 91–97.

Figure 5:
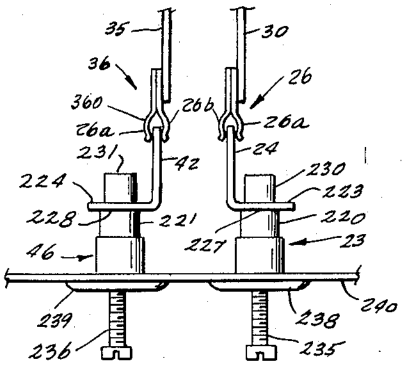
Figure 5 is a detail view of the contact arrangement in the preselector of the present invention.

As seen more clearly in Figure 5, female contacts 26 and 27 engage at each position of shaft 210 as determined by the positioning device 212 male contacts 24 and 25 respectively.

More specifically, male contact 24 which is thicker than the separation between female contact plates 26a and 26b when not in the engaged position causes contacts 26a and 26b to move apart against the bias of the spring material of which the two contacts are made.

By this means a good electrical contact engagement is obtained between the female contact 26 and the male contact 24. Of course, the same engagement is obtained between the second female contact 27 and its male contact 25.

The other plate 35 mounted on shaft 210 and having also on its periphery a series of female contacts 36 and 37 at the position described above for plate 30 has its female contacts 36 and 37 in engagement with the male contacts 42 and 43, respectively. Male contacts 24 and 42 are shown in the present embodiment as being bent at one end to engage the outer plates 220 and 221 of trimming capacitors 23 and 46, respectively.

More specifically, male contacts 24 and 42 are made of a good electrical conductor and are provided with bent portions 223 and 224, respectively, having at their centers appropriate circular openings 227 and 228 surrounding and electrically engaging the silver plates 220 and 211 on ceramic cylinders 230 and 231 forming the dielectric of capacitors 23 and 46, respectively.

As seen in Figure 5, capacitors 23 and 46 are each provided with a mounting screw 235 and 236, respectively, each of which engages a washer 238 and 239, respectively, then the base 240 of chassis 200 and finally the appropriately threaded interiors of ceramic cylinders 230 and 231. Screws 235 and 236 in conjunction with the washers 238 and 239, respectively, serve also as the grounded plate of capacitors 23 and 46, respectively.

By such a construction it is possible to utilize the physical features of capacitors 23 and 46 to mechanically mount male contacts 24 and 42.

It is now necessary to point out that although in the present embodiment the male contacts were shown as stationary with the female contacts all being mounted on the dielectric plates 30, 35, 91 and 97, the reverse arrangement is also possible; that is, placing the male contacts on the dielectric plates and the female contacts on the chassis.

The latter arrangement, however, has the main disadvantage that since the stationary contacts are worn by the continuous friction of the movable contacts as they slide around them, the stationary female contacts would become defective after relatively short life. If the male contacts are stationary, on the other hand, since they can be made as strong as desired, the continuous friction against them by the female movable contacts will produce no appreciable wear.

Positioned between capacitors 46 and 23 is a metallic ground shield 120. The function of shield 120 is to provide electrical separation between the two portions of the preselector and more specifically to avoid any coupling, inductive and capacitive, between capacitors 23 and 46 and their associated circuits.

The second pair of male contacts 43 and 25 are mounted on a grounding block 121 of conducting material. The previously mentioned shield or grounding plate 120 actually extends from the grounding block 121 so that the same ground is practically obtained for the circuits connected to this portion of base 240 of chassis 200. Also electricaly connected to grounding block 121 is coil 22. The other side of coil 22, as can be seen, for example in Figure 1, is connected to the high side of capacitance 23. In Figure 3, in fact, the other side of coil 22 is seen to be connected to the plate 220 of capacitor 23. Connected to an intermediate position of coil 22 is the internal contacts 245 of a coaxial cable junction 246.

While in the present embodiment a coaxial cable junction 246 is used for connecting input transformer 15 to the preselector circuits, any other suitable junction may be substituted in its place.

Also connected between grounding block 121 and plate 221 of capacitor 46 is coil 45 which is the output coil for the preselector of the present tuner. Crystal mixer 48 is connected to a tap 47 on coil 45 to obtain the correct impedance relation. Crystal mixer 48 is in its turn connected to the parallel combination of capacitance 49, inductive coil 50 and voltage dividing network 51, 52.

Voltage dividing network 51, 52 as described in connection with Figure 1 consists of two capacitances connected in series where the two capacitances have the same magnitude. The junction point between the two capacitances is brought out by means of conductor 56 which will thus serve as the center conductor of a coaxial cable system to introduce the output from the tuner into the utilization circuits of a television receiver.

Also mounted on base 240 of chassis 200 and in this particular embodiment lying directly flat on base 240 is a positioning spring member 250. Member 250 consists of an arcuate arm of spring material 251 having a flat portion secured to base 240 by suitable means, for example, screws 252 and 253 with the arcuate portion 255 raised from the plane of base 240.

Portion 255 carries two bent portions 257 and 258, each having a V-shaped opening 259 acting as a bearing for a pin 260 carrying a roller 261. When shaft 210 is properly mounted in V-shaped bearings 207 and 208 of chassis 200, then one of the notches 215 of disc 212 mounted on shaft 210 will be in engagement with roller 261.

More precisely, disc 212 when shaft 210 is positioned in the chassis 200 will bear against roller 261 so that a spring engagement is obtained between positioning member 250 and its associated member 212 mounted on shaft 210.

If now the notches 215 are properly aligned with respect to pair of contacts 36 and 37 and 26 and 27, respectively, whenever one of the notches 215 engages the roller 261, the corresponding electrical elements mounted on dielectric plates 30 and 35 are connected through male contacts 42, 43, 24 and 25 to the stationary circuits previously described.

When shaft 210 is properly positioned with respect to chassis 200, the electrical path between the stationary electrical circuit mounted on base 240 of chassis 200 and the movable elements mounted on plates 30 and 35 is reduced to a minimum. By such means the uncontrolled inductance existing between the stationary and movable circuit components of the present tuner is reduced to a minimum so that even on the highest frequency band the control inductances such as 31 and 38 may consist of actual coils, in this instance of gauge 24 wire.

In addition, providing a good ground such as the grounding block 121 and the shielding plate 120 results in minimum uncontrolled coupling. Therefore, effective control over coupling is now easily obtained by the adjustment of the coupling capacitors 40.

To overcome spurious responses in the desired pass band created by the coils other than the one switched in on any band, each coil 38 or 31 at one side which would be grounded in engaged position is permanently grounded through leads 123 and 124, respectively, and hubs 266 to the shaft 210 and, therefore, the chassis 200.

More specifically, these grounding wires 123, 124 are connected on both plates 30 and 35 from the appropriate female switch points corresponding to female contacts 27 or 37 to the center shaft 210. The physical configuration of grounding leads 123 or 124 then forms a spider. If in addition to providing these grounding leads some of the coils are properly oriented, the effect of spurious responses may be made negligible.

Figures 6, 7:
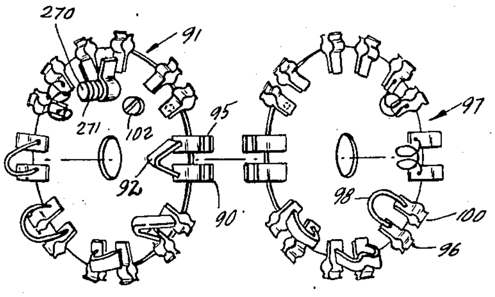
Figure 6 is a perspective view of one of the tuning disc of the tuner of the present invention.
Figure 7 is a perspective view of the tuning disc immediately facing the disc of Figure 6.

As previously mentioned, also mounted on shaft 210 is a second pair of dielectric plates 91 and 97 shown more clearly in Figures 6 and 7, respectively. Mounted on dielectric plate 91 are female contact pairs formed of female contacts 90 and 95. Connected between the female contacts 90 and 95 is coil 92 (see Figure 1).

The inductance of the coil connected between contacts 90 and 95 may be made variable in a number of ways, for example as shown in Figure 6, by introducing a dielectric coil form 270 in the coil 92 and providing a conductive screw 271 in the interior of coil form 270. Thus, by positioning screw 271 with respect to coil 92, it is possible to vary the inductance of coil 92.

Although not shown in Figure 6 or Figure 7, such an arrangement could be applied to every one of the coils shown there. By such trimming means it is possible to accurately tune for the desired frequency of oscillations of oscillator 60 after the operation of mounting discs 91 and 97 on shaft 210 in chassis 200 of this novel tuner.

Similarly, on plate 97 are mounted pairs of female contacts 96 and 100, across which is connected variable inductance coil 98. Although not so shown, this will take the shape approximately of the components shown in Figure 6 which, as previously mentioned, are mounted on plate 91. It is necessary to point out that at the highest UHF bands capacitors 93 and 99 are placed in series with coils 92 and 98 respectively, to provide a larger amount of controllable inductance.

The coupling between the respective electrical components mounted on plate 91 and on plate 97 is obtained by means of the variable capacitance 102. This coupling capacitance 102 is shown in Figure 3 schematically as being formed by a pair of twisted wires. Actually, as shown in one embodiment in Figure 9, it is formed of a dielectric cylinder 275 having two ring-shaped plates 276, 277 around it. The screw 278 is movable in the interior of dielectric cylinder 275, and its movement with respect to the plates 276 and 277 which constitute the plates of padding capacitor 102 will cause a variation of the coupling or better a variation in the capacity between plates 276 and 277 and a corresponding coupling variation between the electrical circuits mounted on plate 91 and the corresponding circuits mounted on plate 97.

Figure 10:
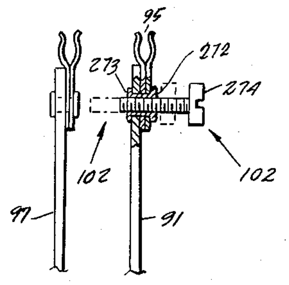
Figure 10 is a detail view of another variable coupling capacitor of the present invention.

A modification of such a padding capacitor is shown in Figure 10. In Figure 10, which is a considerably enlarged view of the padding capacitor 102, the center 272 of rivet 273 which together with a similar rivet serves to hold the female contact 95 is tapped for permitting the position of a small screw 274. By turning screw 274 variation in its proximity from the other plate 97 and the electrical components mounted on plate 97 results in capacity changes in padding capacitor 102. By the insertion of a dielectric material, greater capacity variation may be achieved as desired, although such dielectric material is not shown in Figure 10.

Figure 9:
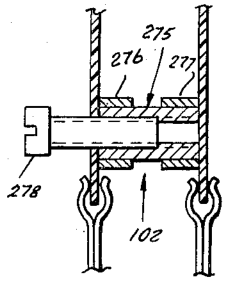
Figure 9 is a detail view of a coupling capacitor used in the present invention.

It is here necessary to point out that although only two embodiments such as those shown in Figures 9 and 10 are here described in detail for padding capacitor 102, many other such modifications employing generally the same principles may be arrived at.

Female contacts 90 and 95 on the dielectric plate 91 engage, when shaft 210 is properly positioned with respect to chassis 200, stationary male contacts 76 and 82.

Male contact 82 is here shown as an integral part of plate 285 of capacitor 85, obtained as an extension of plate 285.

Male contact 76 is in the form of a conductive blade connected and mounted on the grid fin (not shown) of socket 284 of oscillator tube 60, the oscillator tubes being in this case a 6AF4.

Similarly female contacts 96 and 100 mounted on plate 97 engage at certain angular position of shaft 210, stationary male contacts 74 and 84 respectively, where contact 84 is similar to contact 82 and integral with plate 286 of capacitor 85, and contact 74 is mounted on and connected to the plate fin (not shown) of socket 284 of tube 60.

Plates 285 and 286 of variable capacitor 185 are mounted on the base 240 of shaft 210 through an insulating board 292. Board 292 is secured to base 240 by means of screws such as 293 or in any other suitable way. Movable in the interior between plates 285 and 286 is a third plate 295 which serves to vary the capacitance of capacitor 85, that is, the capacitance between plates 285 and 286. Plate 295 which together with stationary plates 285 and 286 must have a specific shape as described hereinafter to provide a straight line frequency characteristic may be made either of a dielectric substance or preferably of a conductive substance such as brass or a combination of the two. Movable plate 295 is carried by an insulating shaft 296 extending through a block 297 and the front plate 201 of chassis 200 so that by applying an appropriate knob (not shown) to the portion 298 of shaft 296 extending beyond chassis 200 it is possible to rotate shaft 296 and plate 295, causing a variation in the capacitance of capacitor 85.

Figure 8:
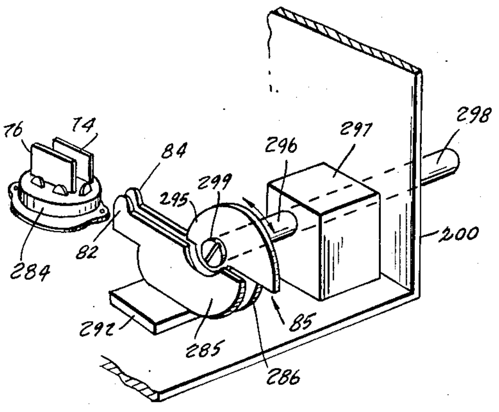
Figure 8 is a detail view of the channel selecting oscillator capacitor of the present invention.

It will be noted that in Figure 8 shaft 295 was shown terminated at the movable plate 295 which is then mounted on shaft 296 by means of a screw 299.

In Figure 3, this mounting means is shown in a modification. There, in fact, shaft 296 continues beyond the capacitor 85 and ends with a transversely cut portion 300. Movable plate 295 is then mounted on shaft 296 in any other suitable way. The necessity for extending shaft 295 and providing its end with a transversely cut portion arises from the fact that, as hereinafter described, it is necessary to have a compensating device for variations in the pass band caused by variations in the impedance presented to the oscillator injection over the band.

More specifically, if a fixed injection method is used to inject signals from the oscillator 60 into the crystal mixer 48, it is found that as the oscillator frequency is varied over any given pass band, the injection current through the detector 48 varies, thereby changing the pass band response between different oscillator settings on the same band, oscillator settings which are provided by rotation of the previously mentioned shaft 296 and, therefore, variation of capacitance 85.

The reason for this phenomenon is that for a fixed pass band preselector such as the one shown in Figures 1 and 3 and with the oscillator operating approximately forty megacycles higher than the incoming television signal, the oscillator frequency moves from a point on the pass band to the skirt outside the pass band as the oscillator 60 is tuned from minimum to maximum frequency over a given band by variation of capacitance 85.

The compensating device used in the present invention consists of a copper strap 110 having one end appropriately bent and positioned for coupling with the high plate of capacitor 46 and the other side mounted by means of any appropriate means, as for example by screw 310, to the insulating block 292. To this end is connected a strip 311 of spring material in close proximity to capacitor 85.

It is, of course, not necessary to mention that the spring material of which strip 311 is made must also be a good conductor. The end of strip 311 bears against the transversely cut portion 300 of shaft 296 so that the transversely cut portion 300 acts as a cam and the spring strip 311 as the cam follower where the cam 300 is operated by rotation of shaft 296. Thus, as the oscillator frequency is varied by rotation of shaft 296 and corresponding movement of plate 295 with respect to stationary plates 285 and 286, the injection take off is changed in its distance relation, that is, in its proximity from stator plate 285 compensating for the effect described above through equal and opposed impedance changes.

It was found that the injection current when using the above injection method varies over a given band by a very small amount. This results in good band pass stability with change in oscillator frequency over any given band.

In addition, it was found that with the present injection method the ratio of maximum injection current on any one band to minimum current on any other band is no greater than 2:1 over the entire U. H. F. spectrum. The above figures are given only to show the possibilities inherent in such a compensating method, and they are in no way critical for the construction of an injection device.

It was mentioned before that capacitor 85 must have a straight line frequency characteristic. What is meant is that capacitor 85 should through equal angular rotations go through the same number of channels regardless of the frequency of operation of the oscillator 60 to which capacitor 85 is connected. In addition, it should provide, for example, ten channels through a preselected angular rotation of plate 295 where the ten channels must be equally spaced from each other or better by the same angular rotation of shaft 296 it is possible to go from one channel to the next and from the next to the third and so on.

In other words, the basic requirement of a straight line frequency capacitor is that the rate of change of frequency with respect to angular rotation of the capacitor be equal to a constant. By taking this requirement into consideration and the practical configuration of the rotor and stator plates such as those shown in Figure 8, it is possible to arrive at the following equation:

$$r=\sqrt{(r_0^2-r_i^2)\left(\frac{f_0}{f}\right)^3+r_i^2} \qquad (1)$$

which expresses the shape of rotor 295 of a practical 180° straight line frequency capacitor in very simple terms as a function of initial geometry and frequency. In fact, see Figure 11, $r_0$ is the length of rotor 295 when the angular rotation $\theta$ is equal to 0.

In other words, $r_0$ is the initial radial dimension of movable plate 295 corresponding to an angle of $\theta$ of 0°, $r_i$ is the radius of the circular opening 315 in stator plates 285 and 286 of capacitor 85 and finally $r$ is the radius vector of the desired locus, $f_0$ the highest frequency obtainable corresponding to complete disengagement between rotor 295 and stators 285 and 286 and, therefore, to an angle of $\theta=0$.

It is thus seen at first that for one band of frequencies to be covered (or more exactly for one ratio of highest to lowest frequencies to be covered in a 180° rotation), there is one universal rotor shape. Conversely, given the shape of rotor 295, frequency rotation relationship for one band of frequencies, no adjustments of inductance, minimum capacity $c_0$, number of stator plates 285, 286 and rotor plates 295 and spacing between them can produce a perfectly linear relationship on another band of frequencies if the ratio of $$\frac{f_0}{f_{min}}$$

is different where $f_{min}$ denotes the lowest frequency of any band corresponding to a complete 180° rotation.

For example, if it is desired to design a straight line frequency capacitor over the range of 470 to 890 megacycles as would be the case for U. H. F. television continuously tuned preselector, it is possible to assume for $r_0$ the value of unity, for $r_i$ ¾ of $r_0$, namely ¾. The relationship between $r_0$ and $r_i$ is usually governed by mechanical design features, clearances, etc.

By the use of the previously mentioned equation, the shape of the rotor 295 can now be easily calculated:

$$r=\sqrt{0.4375\left(\frac{890}{f}\right)^3+0.5625}$$

| f-Mc. | $\theta$ | r |
|---|---|---|
| 890 | 0 | 1.000 |
| 785 | 45 | 1.0955 |
| 680 | 90 | 1.2423 |
| 575 | 135 | 1.4781 |
| 470 | 180 | 1.8797 |

The above table gives some calculated value of $r$ for the previous example. It should be realized that these values are universal and can be scaled up or down by simple multiplication as long as the ratio of $$\frac{r_0}{r_i}$$

is maintained the same as originally assumed, for example, 1:¾ as in this example.

To further illustrate the unique dependence of rotor shape on frequency ratio, it will be assumed that a straight line frequency oscillator is to be designed to track perfectly with a preselector operating forty megacycles above the incoming television signals. The range in such an oscillator would then be 510 to 930 megacycles for U. H. F. operation. The oscillator rotor shape which is the one now under consideration will have to be slightly different from that of the preselector and governed by the following formula:

$$r=\sqrt{0.4375\left(\frac{930}{f}\right)^3+0.5625}$$

where the same ratio of $r_0$:$r_i$ was chosen, namely, 1:¾.

| f—Mc. | $\theta$—deg. | r |
|---|---|---|
| 930 | 0 | 1.000 |
| 720 | 90 | 1.2269 |
| 510 | 180 | 1.7931 |

The above table giving three points on the locus of the shape of the oscillator rotor 295 indicates the expected discrepancy between oscillator and preselector rotor shapes. This shows that the oscillator and preselector rotor shapes are each determined by their ratio of $$\frac{f_0}{f_{min}}$$

In the present oscillator the same straight line frequency variable capacitor 85, using the same rotor shape, must be used in each band. Since, on the other hand, the ratio of $$\frac{f_0}{f_{min}}$$

where as previously mentioned $f_{min}$ corresponds to 180° rotation of plate 295 ($\theta$=180°) or the lowest frequency of any band, is different in each band, the shape of rotor 295 must be designed for some intermediate band, for example, in U. H. F. for the range of 669–729 megacycles.

If now, for example, $r_0=\frac{13}{32}''$, $r_i=\frac{5}{32}''$, the locus of the rotor shape will be given by $$r=\sqrt{0.14063\left(\frac{729}{f}\right)^3+0.02441}$$

The above formula gives $r$ in inches since $r_0$ and $r_i$ were assumed to be definite values rather than unit values as previously assumed.

| f—Mc. | θ—deg. | r—in. |
|---|---|---|
| 729 | 0 | .40625 |
| 699 | 90 | .42887 |
| 669 | 180 | .45428 |

This table indicates three points on the locus of the shape of rotor 295 of the oscillator for the previous example. In this case the exact shape can be approximated by a semi-circle of .43026" radius with a center of rotation displaced by .02401" from the center of the semi-circle.

The above examples show that the design of the shape of rotor 295 should be the starting point in the design of a straight line frequency capacitor irrespective of circuit values of the inductance, the minimum capacitance desired and the maximum capacitance desired, namely, $C_{min}$ and $C_{max}$.

However, since these circuit values must also follow some relation in accordance with frequency requirements, they are taken into consideration in the next phase of the development of such a capacitor.

In addition to having correctly shaped rotor 295, the following relation must hold for the circuit in which the capacitor is operated if a required band of frequencies is to be covered by this straight line frequency capacitor:

$$\left(\frac{f_0}{f_{min}}\right)^2=\frac{C_{max}}{C_0}$$

$$f_0=\frac{1}{2\pi\sqrt{LC_0}}$$

where $C_{max}$ is given by $$\frac{0.2246Kn\Delta A_{max}}{d}+C_0(\text{in } \mu\mu f)$$

where $n$ is the number of dielectric spaces, K is the dielectric constant, $d$ is the thickness of the dielectric or spacing between plates 285 and 286 in inches and $\Delta A_{max}$ is the maximum engaged rotor area in square inches.

It is then possible to obtain the following equation:

$$\frac{Kn(r_0^2-r_i^2)}{d}=\frac{(C_{max}-C_0)}{0.2246B}$$

where $$b=\frac{\pi f_0}{4\Delta f}\left(\frac{f_0}{f_{min}}\right)^2-1$$

With the aid of the above equation it is then possible to complete the details of the required straight line frequency capacitor design.

In the above equation on its right-hand side there is a known fixed quantity determined by the frequency requirements, an estimate of $C_0$ and a value of $C_{max}$ as computed from one of the previously mentioned equations. On the left-hand side appear all the design parameters needed for this construction. The proper dielectric material can then be chosen, the number of spacings and plates between them can be decided upon and $r_0$ and $r_i$ can then be scaled to the proper size to produce the value called for in the above equation.

In practice, actually it is better to estimate a slightly higher value of $C_0$ than the one actually existing in the circuit.

It is necessary also to point out that in the above equations all lumped and stray circuit capacity $C_0$ has been considered to be in parallel with the straight line frequency capacitor.

Figure 12:
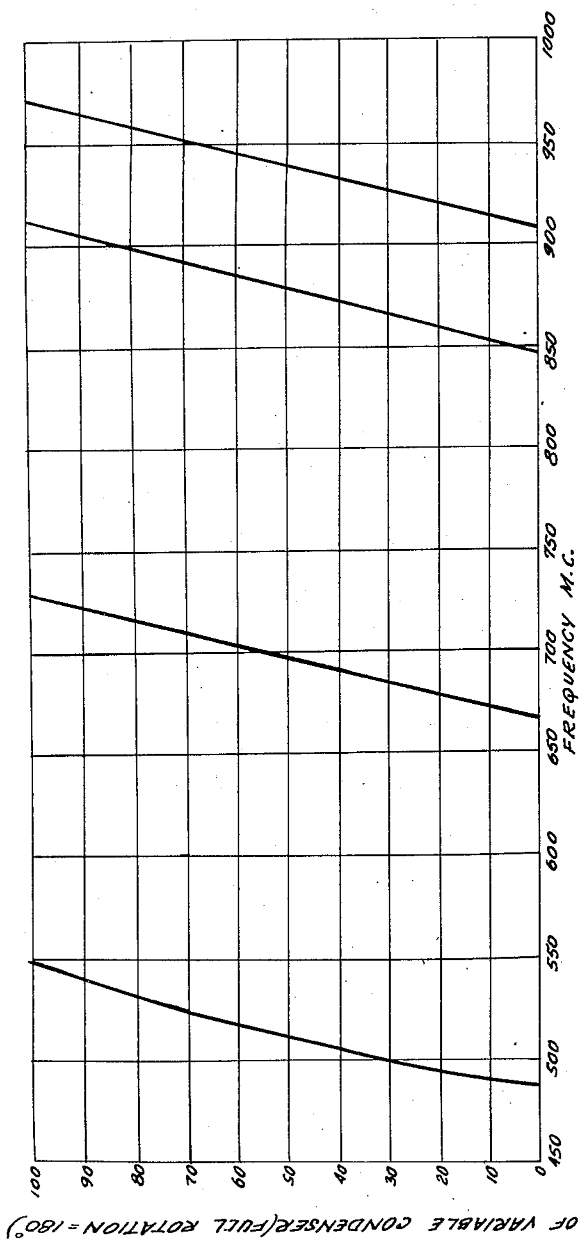
Figure 12 is a plot of the rotation of the variable capacitor plate vs. ultra high frequency, showing the linearity obtained.

That such a straight line frequency capacitor may be built following the above described procedure becomes evident when taking into consideration the curves shown in Figure 12. Figure 12 is, in fact, a plot of the angular rotation of the rotor plate 295 with respect to the stator plates, versus four U. H. F. bands.

More specifically, plot A is for one of the lower frequency bands. Plot B is for an intermediate frequency band. Plots C and D are for the highest frequency bands.

From Figure 12 it is seen that plots A, B, C and D approximate a straight line in the desired regions.

It was mentioned earlier that the same kind of straight line frequency capacitor can be built in the preselector. While this is not shown in Figure 3, it is shown diagrammatically in its physical appearance in Figures 2 and 4, respectively. In Figure 2 the preselector tuning capacitances are denoted as previously mentioned by numerals 130, 131, the same numerals being also used for the same capacitors of Figure 4.

Capacitor 130 consists of stator plates 350 and 351. Stator plate 350 is mounted on an insulating block 353 secured on the base 240 of chassis 200 in any suitable way. Stator plate 351 is connected to ground, that is, to the base 240 of chassis 200 and on both ends. More specifically, at one end 354 it is firmly secured and in good electrical engagement with the grounding block of the type previously described and denoted, therefore, with the same numeral 121 as used in Figure 3.

The other capacitor 131 is also provided with a pair of stator plates, one of which is the previously mentioned 351 and the other stator plate 355. Stator plate 355 is mounted on an insulating base 356 secured to base 240 of chassis 200 by any appropriate means, as, for example, a screw 357. Insulating blocks 353 and 356 serve to maintain plates 350 and 355 above ground, the ground being connected to the other plate of capacitors 130, 131, that is, plate 351.

Since, as described in connection with Figure 2, capacitances 130, 131 have the function of tuning the preselector so that it may pass the desired frequencies, it is possible to do without the previously mentioned trimmer capacitors 23 and 46. Actually, of the two, only trimmer 46 is eliminated since the adjustment obtainable with trimmer 23 serves to accurately balance one part of the preselector, the part to which capacitor 130 is connected with the other part of the preselector in which capacitor 131 is connected.

Plate 351 serves also as a shielding device between the above-mentioned two portions of the preselector.

The remaining parts of the circuit remain unchanged with respect to the embodiment shown in Figures 1 and 3 and are thereby denoted by the same numerals with the exception of the injecting device.

Figure 4:
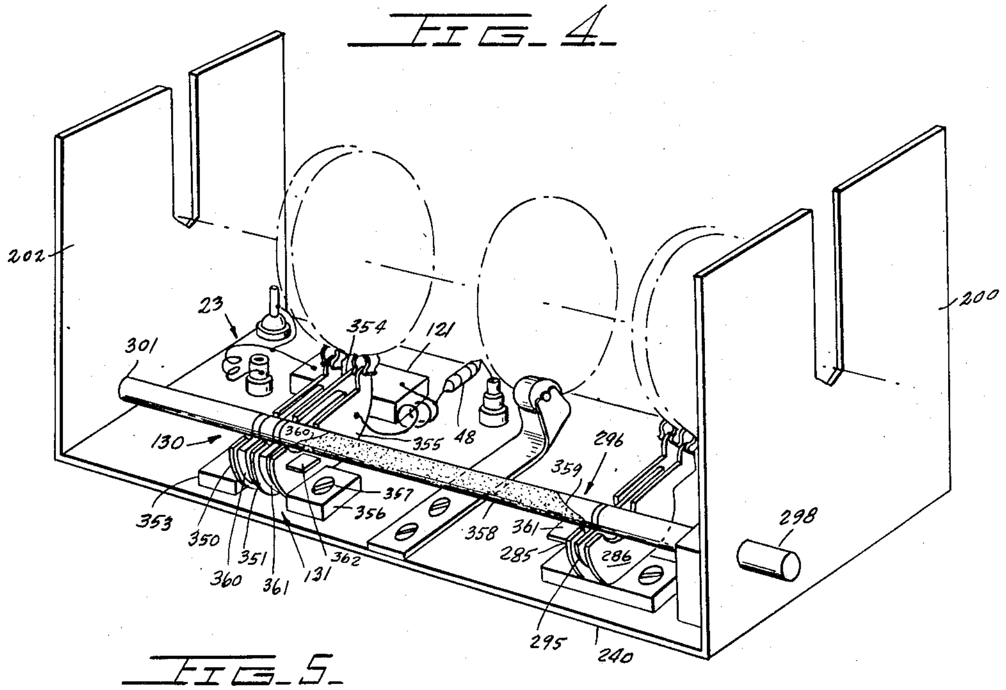
Figure 4 is an exploded view of the tuner of Figure 2 showing the variable injection means.

Referring in fact to the embodiment of Figure 4, shaft 296, which as previously mentioned carries variable plate 295 of capacitor 80 extends beyond capacitor 85 so as to carry also plates 360 and 361 of capacitors 130 and 131 in the preselector stage, so that a single rotation of shaft 296 produces the necessary changes in the capacitance of capacitors 85, 130 and 131.

While one end 238 of shaft 236 extends through the front plate 201 of chassis 200, the other end 301 extends through back plate 202 of chassis 200, through an appropriate opening in chassis 200, serving as a bearing.

The portion 358 of shaft 296, intermediate between capacitors 85 and 131 is silver plated so that plated springs 359 and 360 are obtained at the portions of section 358 direct to plates 285 and 355 of capacitors 85 and 131.

In this second embodiment, plates 285 and 355 are provided with conductive plates 361 and 362 respectively, shown in Figure 4 as perpendicular to plates 285 and 355. Plates 361 and 362 may be obtained from plates 285 and 355 by appropriate stamping.

By such an arrangement of platings 359 and 360 connected by the plating portion 358 or shaft 396 and conductive plates 361 and 362 two variable coupling capacitors or movable injection points are obtained since as shaft 296 is rotated the area of tapered platings 359 and 360 directly facing plates 361 and 362 varies.

The variation is such that minimum capacitance or coupling exists between plating 359 and plate 361 and plating 360 and plate 362 when capacitors 85 and 131 are set to minimum capacitance and maximum frequency.

Thus as the frequency is changed through rotation of shaft 296, the amount of injection into the mixer 48 is also changed in a desired way to obtain optimum and constant conversion at all frequencies.

Figure 11:
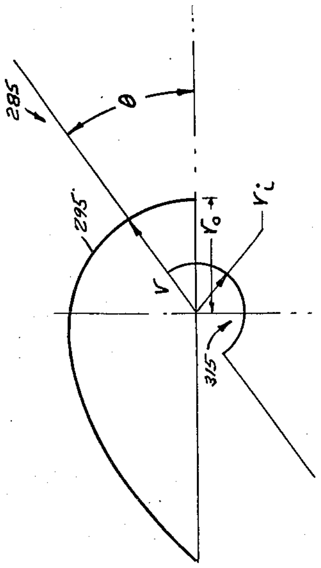
Figure 11 is a schematic view of the straight line frequency capacitor of the present invention.

As for plates 360 and 361, in this example made of brass, their shape may be determined as described in connection with Figures 11 and 12.

Figure 13:
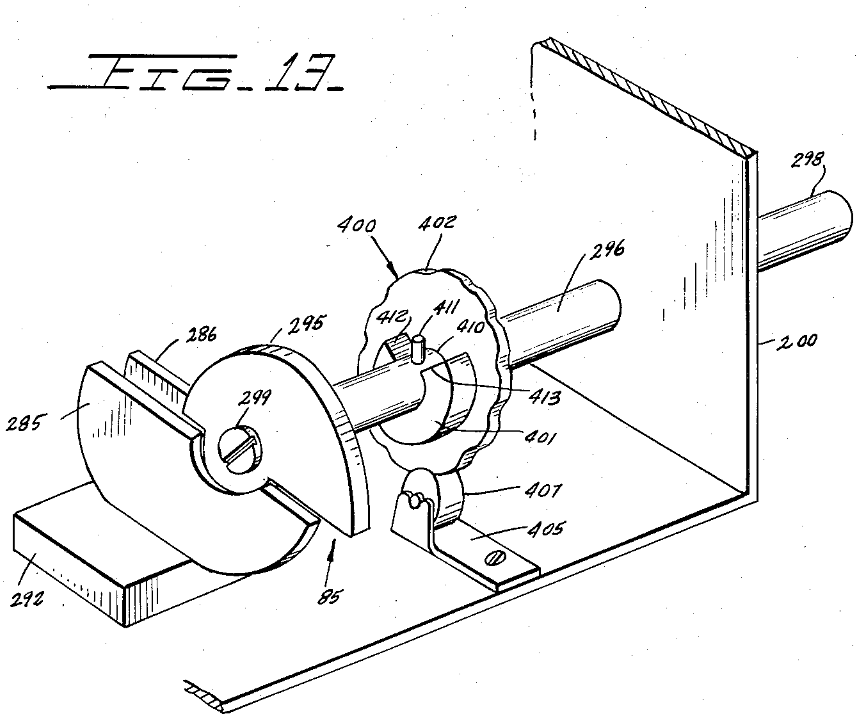
Figure 13 is a perspective view of a modified channel selecting capacitor, provided with step tuning means.

Channel selecting capacitor 85 may also be provided with positive positioning means as shown in Figure 13. In Figure 13 a disc 400 is rigidly secured by suitable means, as for example a bushing 401, on shaft 296 through which plate 295 is moved with respect to plates 285 and 286 of capacitor 85.

Disc 400 is provided with circumferential notches 402 equal in number to the number of channels in each band so that if each band encompasses ten channels to be selected through rotation of shaft 296, the notches 402 on disc 400 will also be ten. Cooperating with disc 400 is a resilient member 405 secured to chassis 200 in any suitable way and carrying at one end a roller 407 for engaging successively notches 402 at rotation of shaft 296.

Disc 400 is positioned on shaft 296 so that when one notch 402 is engaged by roller 407, capacitor 85 is tuned for reception of a particular channel in the band determined by the position of discs 30, 35, 91, 97.

To provide fine tuning, bushing 401 may have a cut-out portion 410, and shaft 296 may be provided with a pin 411 so that play is obtained between stops 412 and 413, the amount of play being determined by dimensions of cut-out 410.

By the means described above, it is then possible to have complete discrete tuning not only in the band level but also in the channel level in addition to any desired amount of fine tuning.

It will be noted that the channel selector was described as being a variable capacitance. Such a variable capacitor can be substituted with appropriate changes in circuitry with a variable inductance.

Moreover, although one method of fine tuning was described above, many other such means will now be apparent to persons well versed in the art.

It will be noted (see Figure 3) that provisions are made for releasably securing shaft 210 in bearings 207 and 208 of chassis 200. Such means, as shown in Figure 3, may consist of a wire spring 420 secured at one end to a screw 421 and at the other bearing against a second screw, not shown. Holding means 420, 421 and the second screw are duplicated in the rear plates 202 of chassis 200.

When it is desired to mount shaft 210 in chassis 200, the wire springs 420 are removed from engagement with screws 421, and shaft 210 is slid into position in bearings 207 and 208.

Wire springs 420 are then bent to reengage screws 421 to firmly hold shaft 210 in its bearings 207 and 208.

The rotatable structure consisting of plates 30, 35, 91, 97 and disc 212 is mounted on shaft 210 by spot welding hubs 266 and 213 on shaft 210 while maintaining them in good alignment by means of a jig. Plates 30, 35, 91 and 97 are then mounted on the hubs 266 by appropriate means, for example, screws.

It is found that such spot welding mounting is sufficient to maintain the same mechanical alignment during the life of this novel tuner.

Other means for maintaining such an alignment can, of course, be used: for example, additional shafts parallel to shaft 210 which tie together plates 30, 35, 91 and 97 and positioning disc 212. By means of such tie bars, the mounting operation of structures 30—35—91—97—212 becomes also simpler since now good alignment is certainly arrived at during assembly.

In the foregoing, I have described this invention only in connection with preferred embodiments thereof. Many variations and modifications of the principles of this invention within the scope of the description herein are obvious. Accordingly I prefer to be bound not by the specific disclosure herein, but only by the appended claims.

I claim:

1. In a discrete type tuner for selection of U. H. F. channels, an oscillator supplying heterodyning signals, said oscillator comprising a fixed circuit and a rotatable structure, a multi-electrode electron tube in said fixed circuit and a plurality of male contacts connected to the electrodes of said electron tube, said rotatable structure consisting of a pair of dielectric plates, a shaft for rotating said structure, said dielectric plates being fixedly mounted on said shaft for rotation with said shaft, tuning means mounted on said dielectric plates, a plurality of female contacts also mounted on said dielectric plates and connected to the terminals of said tuning means and extending outwardly of said dielectric plates for engagement with said plurality of male contacts at rotation of said shaft to tune said oscillator to individual bands of ultra-high frequency, said tuning means consisting of reactance elements, coupling means between one reactance element on one plate and the corresponding reactance element on the other plate, said coupling means including a variable capacitor for selecting U. H. F. channels and a variable capacitor for adjusting the band spread, said coupling means producing equal band spread irrespective of the position of any band in the U. H. F. range.

2. In a discrete type tuner for selection of U. H. F. channels, an oscillator supplying heterodyning signals, said oscillator comprising a fixed circuit and a rotatable structure, a multi-electrode electron tube in said fixed circuit and a plurality of male contacts connected to the electrodes of said electron tube, said rotatable structure consisting of a pair of dielectric plates, a shaft for rotating said structure, said dielectric plates being fixedly mounted on said shaft for rotation with said shaft, tuning means mounted on said dielectric plates, a plurality of female contacts also mounted on said dielectric plates and connected to the terminals of said tuning means and extending outwardly of said dielectric plates for engagement with said plurality of male contacts at rotation of said shaft to tune said oscillator to individual bands of ultra high frequency, said tuning means consisting of reactance elements, capacitive coupling means between one reactance element on one plate and the corresponding reactance element on the other plate, said coupling means being variable and producing equal band spread irrespective of the position of any band in the U. H. F. range, one plate of said coupling capacitor being mounted on one of said dielectric plates, the other plate of said coupling capacitor being mounted on the other dielectric plate in alignment with the first, said capacitor plates being ring shaped, a dielectric cylinder mounted in the interior of both of said ring shaped plates forming the said coupling capacitor, screw means movable in the interior of said dielectric cylinder for varying the capacitance between the said two capacitor plates.

3. In a discrete type tuner for selection of U. H. F. channels, an oscillator supplying heterodyning signals, said oscillator comprising a fixed circuit and a structure rotatable with respect to said fixed circuit, a multi-electrode electron tube in said fixed circuit, a plurality of male contacts also in said fixed circuit and connected to the electrodes of said electron tube, tuning means mounted on said rotatable structure, a plurality of female contacts at the terminals of said tuning means and extending outwardly of said rotatable structure for engaging the said plurality of male contacts at rotation of said structure to tune said oscillator to individual bands of ultra-high frequency, said tuning means consisting of pairs of inductance-capacitance series circuits, means coupling the series circuits in each pair and producing equal band spread irrespective of the band being tuned, and means for tuning said oscillator to individual frequencies within the said U. H. F. bands, said individual frequency tuning means comprising a variable capacitor, a second plurality of male contacts connected to the plates of the said variable capacitor, a second plurality of female contacts at the other terminals of said rotatable tuning means and extending outwardly of said rotatable structure for engaging the said second plurality of male contacts at rotation of said structure.

4. In a discrete type tuner for selection of U. H. F. channels, an oscillator supplying heterodyning signals, said oscillator comprising a fixed circuit and a structure rotatable with respect to said fixed circuit, a multi-electrode electron tube in said fixed circuit, a plurality of male contacts also in said fixed circuit, a plurality of male contacts also in said fixed circuit and connected to the electrodes of said electron tube, tuning means mounted on said rotatable structure, a plurality of female contacts at the terminals of said tuning means and extending outwardly of said rotatable structure for engaging the said plurality of male contacts at rotation of said structure to tune said oscillator to individual bands of ultra-high frequency, said tuning means consisting of pairs of inductance-capacitance series circuits, means coupling the series circuits in each pair and producing equal band spread irrespective of the band being tuned, and means for tuning said oscillator to individual frequencies within the said U. H. F. bands, said individual frequency tuning means comprising a variable capacitor, a second plurality of male contacts integral with the plates of the said variable capacitor, a second plurality of female contacts at the other terminals of said rotatable tuning means and extending outwardly of said rotatable structure for engaging the said second plurality of male contacts at rotation of said structure, means for varying the capacitance between the said capacitor plates, a shaft operating said capacitor varying means.

5. In a discrete type tuner for selection of U. H. F. channels, an oscillator supplying heterodyning signals, said oscillator comprising a fixed circuit and a structure rotatable with respect to said fixed circuit, a multi-electrode electron tube in said fixed circuit, a plurality of male contacts also in said fixed circuit and connected to the electrodes of said electron tube, tuning means mounted on said rotatable structure, a plurality of female contacts at the terminals of said tuning means and extending outwardly of said rotatable structure for engaging the said plurality of male contacts at rotation of said structure to tune said oscillator to individual bands of ultra high frequency, said tuning means consisting of pairs of inductance-capacitance series circuits, means coupling the series circuits in each pair and producing equal band spread irrespective of the band being tuned, and means for tuning said oscillator to individual frequencies within the said U. H. F. bands, said individual frequency tuning means comprising a variable capacitor, a second plurality of male contacts connected to the plates of the said variable capacitor, a second plurality of female contacts at the other terminal of said rotatable tuning means and extending outwardly of said rotatable structure for engaging the said second plurality of male contacts at rotation of said structure, means for varying the capacitance between the said capacitor plates, a shaft operating said capacitor varying means, discrete positioning and fine tuning means mounted on said shaft, means fixedly mounted on said tuner and cooperating with said discrete and fine tuning means.

6. In a discrete type tuner for selection of U. H. F. channels, an oscillator supplying heterodyning signals, said oscillator comprising a fixed circuit and a structure rotatable with respect to said fixed circuit, a multi-electrode electron tube in said fixed circuit, a plurality of male contacts also in said fixed circuit and connected to the electrodes of said electron tube, tuning means mounted on said rotatable structure, a plurality of female contacts at the terminals of said tuning means and extending outwardly of said rotatable structure for engaging the said plurality of male contacts at rotation of said structure to tune said oscillator to individual bands of ultra-high frequency, said tuning means consisting of pairs of inductive circuits for tuning the lower frequency bands and consisting of pairs of inductance-capacitance series circuits for tuning at the higher frequency bands, said series capacitance permitting the use of series inductances of controllable dimensions, means coupling the series circuits in each pair and producing equal band spread irrespective of the band being tuned.

7. In a discrete type tuner for selection of U. H. F. channels, an oscillator supplying heterodyning signals, said oscillator comprising a fixed circuit and a structure rotatable with respect to said fixed circuit, a multi-electrode electron tube in said fixed circuit, a plurality of male contacts also in said fixed circuit and connected to the electrodes of said electron tube, tuning means mounted on said rotatable structure, a plurality of female contacts at the terminals of said tuning means and extending outwardly of said rotatable structure for engaging the said plurality of male contacts at rotation of said structure to tune said oscillator to individual bands of ultra-high frequency, said tuning means consisting of pairs of inductive circuits for tuning the lower frequency bands and consisting of pairs of inductance-capacitance series circuits for tuning at the higher frequency bands, said series capacitance permitting the use of series inductances of controllable dimensions, means coupling the series circuits in each pair and producing equal band spread irrespective of the band being tuned, and means for tuning said oscillator to individual frequencies within the said U. H. F. bands.

References Cited in the file of this patent

UNITED STATES PATENTS

| | | |
|---|---|---|
| 2,078,908 | Harrison | Apr. 27, 1937 |
| 2,078,909 | Gunther | Apr. 27, 1937 |
| 2,137,266 | Case | Nov. 22, 1938 |
| 2,150,553 | Koch | Mar. 14, 1939 |
| 2,423,152 | Mitchell | July 1, 1947 |
| 2,430,886 | Peterson | Nov. 18, 1947 |
| 2,469,941 | Abrams | May 10, 1949 |
| 2,551,228 | Achenbach | May 1, 1951 |
| 2,632,803 | Cotsworth | Mar. 24, 1953 |